Oct. 10, 1967 T. F. HAGGAI 3,346,814

DUAL LOOP DEMODULATOR INCLUDING A PHASE LOCK LOOP AND AN AFC LOOP

Filed July 29, 1964 2 Sheets-Sheet 1

INVENTOR.
THEODORE F. HAGGAI,
BY
Walter J. Adam
ATTORNEY.

Oct. 10, 1967 T. F. HAGGAI 3,346,814

DUAL LOOP DEMODULATOR INCLUDING A PHASE LOCK LOOP AND AN AFC LOOP

Filed July 29, 1964 2 Sheets-Sheet 2

INVENTOR
THEODORE F. HAGGAI,
BY Walter J. Adam
ATTORNEY.

1

3,346,814
DUAL LOOP DEMODULATOR INCLUDING A PHASE LOCK LOOP AND AN AFC LOOP
Theodore F. Haggai, Costa Mesa, Calif., assignor to Hughes Aircraft Company, Culver City, Calif., a corporation of Delaware
Filed July 29, 1964, Ser. No. 385,941
12 Claims. (Cl. 329—122)

ABSTRACT OF THE DISCLOSURE

A demodulator having a dual loop control to provide a high degree of sensitivity and operable in response to a signal with a variable average input frequency. The system includes a phase detector having a first input terminal receiving a frequency modulated signal through a path including a mixer and a narrow band filter. A demodulator loop includes high pass filter and a voltage controlled oscillator coupled between an output terminal and a second input terminal of the phase detector. An automatic frequency control loop including an integrator with a narrow pass band and a voltage controlled oscillator is coupled between the output terminal of the phase detector and the mixer.

This invention relates to FM (frequency modulation) demodulators, and particularly to a dual loop phase lock FM demodulator that includes automatic frequency control.

It has been shown that the sensitivity of a phase lock FM demodulator can be enhanced by preceding the loop with an IF (intermediate frequency) filter having a bandwidth only as large as that required to pass the signal spectrum. As described in a patent application, Ser. No. 369,071, filed May 21, 1964, "FM Demodulator System With Improved Sensitivity," by Theodore F. Haggai, and assigned to the same assignee as this application, both improved threshold sensitivity and (under specific conditions outlined therein) output test tone to noise ratio are provided by a demodulator arrangement incorporating a narrow band filter. The demodulator therein is designed with a large loop bandwidth (apart from the noise passed through the IF filter) so that the high loop gain provides a relatively small phase error due to input signal modulation. As a result, one component of phase error that normally degrades threshold sensitivity is substantially reduced to provide a relatively large threshold extension.

In some FM receives such as those utilized with communication satellites, the frequency and uncertainty due to doppler shift, for example, may exceed the bandwidth of the narrow band IF filters. Thus, a frequency control arrangement must be utilized to provide a tuning capability before the signal is applied to the narrow band filter. A conventional limiter-discriminator preceded by a wide band IF filter is substantially unsuitable because of the relatively poor threshold sensitivity as compared to that of the demodulator.

It is therefore an object of this invention to provide an improved FM demodulator system having a high degree of sensitivity and operable with a variable average input frequency.

It is a further object of this invention to provide a simplified FM demodulator system that maintains the average frequency of the received signal centered in a narrow passband while demodulating the high frequency modulations.

It is a still further object of this invention to provide a dual-loop demodulator system in which one loop responds to only the high frequency perturbations and the other loop responds to the low frequency perturbations.

2

It is another object of this invention to provide a highly sensitive FM demodulator having first and second loops with the bandwidths of the loops selected to provide maximum sensitivity.

The demodulator system in accordance with the principles of the invention, is operable with a narrow-band IF filter by centering the input signal in the pass band regardless of frequency drifts. The phase lock system includes a phase detector responsive to a demodulator loop voltage controlled oscillator (VCO) and receiving the input signal from the narrow band filter. A high-pass filter is coupled between the output of the phase detector and the demodulator loop voltage controlled oscillator so that slow carrier drifts are not tracked thereby. An automatic frequency control (AFC) loop includes an integrator having a narrow pass band coupled between the output terminal of the phase detector and an automatic frequency control loop voltage controlled oscillator which only tracks drift and low frequency modulation of the carrier. A mixer responds to the input signal and the signal developed by the automatic frequency control voltage controlled oscillator to apply the IF signal to the narrow band filter with a substantially constant center frequency. The mechanism of phase lock forces the average frequency of the IF signal to be that of the demodulator-loop voltage controlled oscillator which is stable in response to low frequency drifts, as any departure therefrom produces a phase detector output that drives the automatic frequency control loop voltage controlled oscillator until phase error null is achieved. Thus, the reference frequency for the automatic frequency control demodulator loop is that of the demodulator loop voltage controlled oscillator. The automatic frequency control loop bandwidth is selected to be relatively narrow so that a low level of sensitivity is maintained by the demodulator loop. The system in accordance with the invention also includes an arrangement that allows operation when the received signal has a low power level.

The novel features of this invention, as well as the invention itself, both as to its organization and method of operation, will best be understood from the accompanying description taken in connection with the accompanying drawings, in which like reference characters refer to like parts, and in which.

Figure 4:
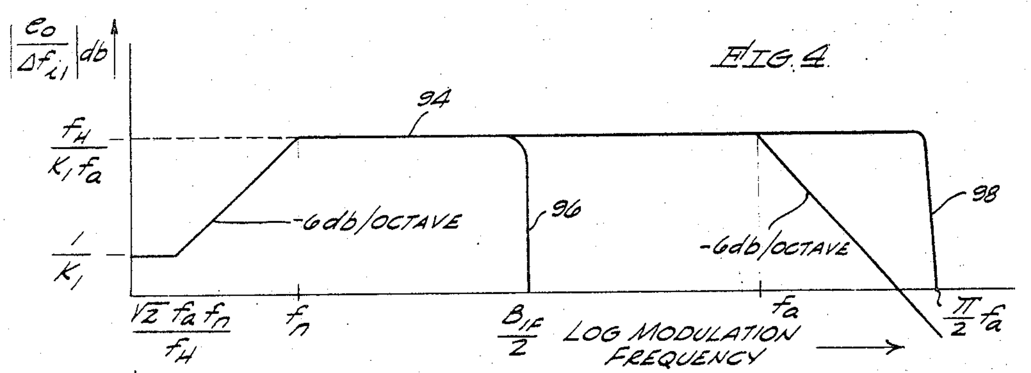
Figure 3:
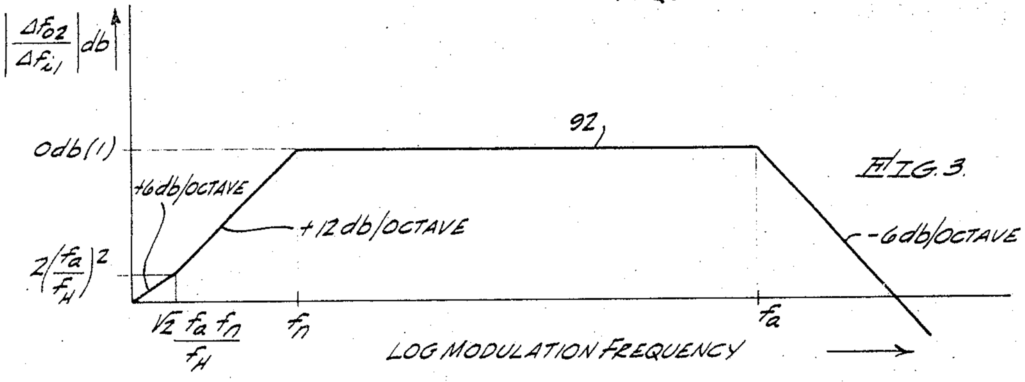

FIG. 3 is an asymptotic graph of the ratio of the frequency deviation of the demodulator loop VCO over the frequency deviation of the input signal versus modulation frequency for explaining the operation of the demodulator loop; and FIG. 4 is a graph of the ratio of baseband voltage over the frequency deviation of the input signal versus modulation frequency for further explaining the operation of the demodulator system in accordance with the invention.

Figure 1:
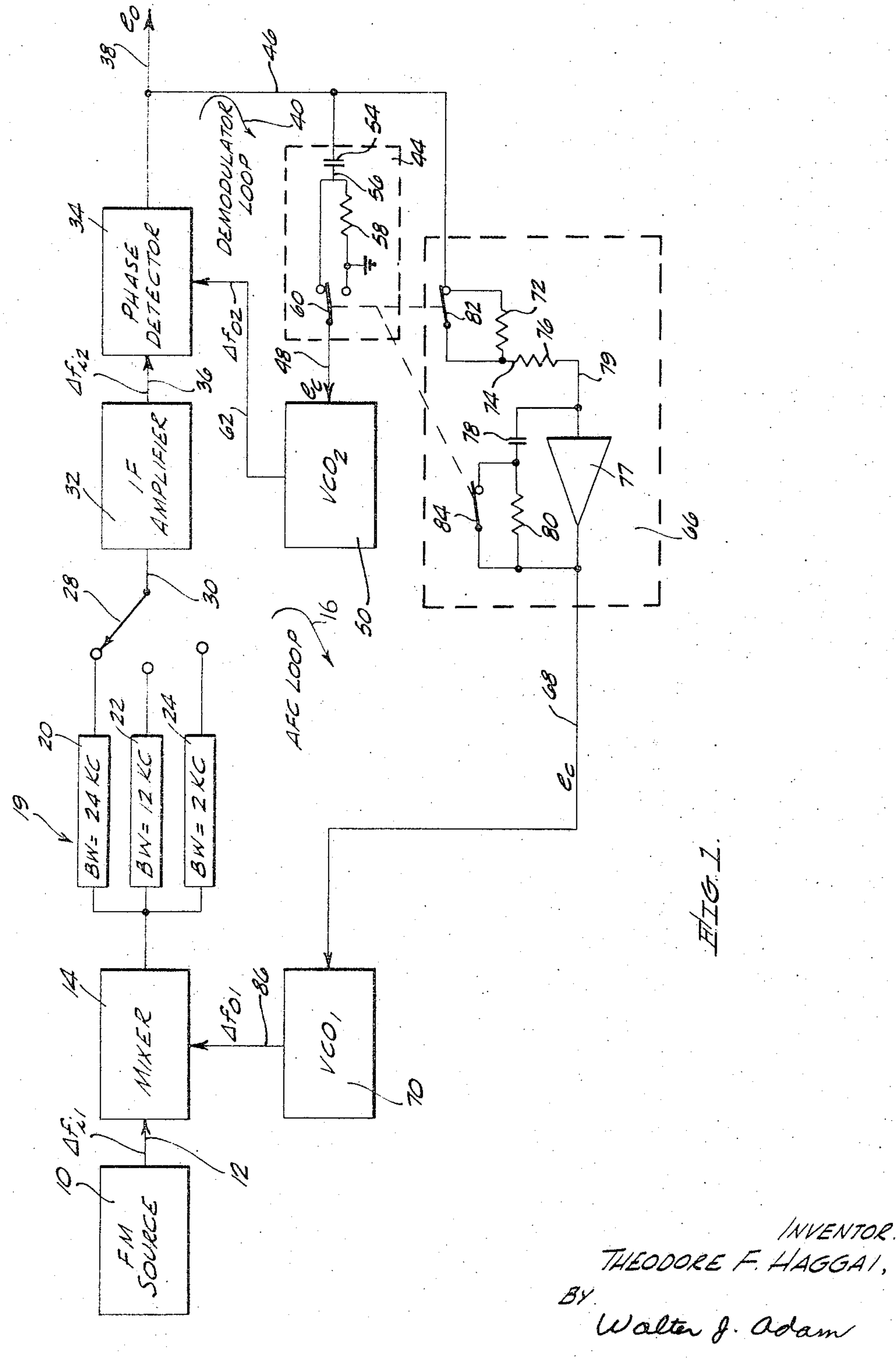
FIG. 1 is a schematic block and circuit diagram of the dual-loop demodulator system in accordance with the principles of the invention.

Referring first to FIG. 1, the demodulator system responds to a modulated carrier signal from an FM (frequency modulation) source 10 which may include a communication receiver, amplifiers, and mixers, to apply an IF (intermediate frequency) signal to a lead 12, $\Delta f_{i1}$ representing the modulation frequency thereof. The signal on the lead 12 is applied to a mixer or heterodyning circuit 14 which is included in an outer automatic frequency control (AFC) loop 16. The frequency centered IF signal is applied from the mixer 14 through a selected narrow band filter 20, 22 or 24 of a filter bank 19 which may have respective bandwidths of 24 kc. (kilocycles), 12 kc. and 2 kc. each centered at the same predetermined IF frequency. A switch 28, which may be an electronic or manual type, selectably connects the filter 20, 22 or 24 to a lead 30 which applies the narrow band signal to an IF amplifier 32. A phase detector 34 receives the signal applied from the amplifier 32 through a lead 36, the signal having a frequency deviation $\Delta f_{12}$. The phase detector 34 applies a baseband signal $e_0$ to an output lead 38 for utilization of the information contained therein, as well known in the art. As well known in the art, a baseband filter or deemphasis network may be utilized subsequent to the lead 38 for responding to the signal $e_0$.

An inner loop or demodulator loop 40 includes a high pass filter 44 coupled from the lead 38 and a lead 46 to a lead 48 and a voltage controlled oscillator 50 also designated at $VCO_2$. The high pass filter 44 may include a coupling capacitor 54 coupled between the lead 46 and a lead 56 which in turn is coupled both through a resistor 58 to ground and through a switch 60 to the lead 48. Thus the voltage controlled oscillator 50 which is AC (alternating current) coupled to the lead 38 is stable in response to low frequency drifts or variations of the input signal because of the choice of time constant provided by the filter 44. The voltage controlled oscillator 50 is coupled through a lead 62 to the phase detector 34. The demodulated voltage may also be derived from the lead 48 in accordance with the principles of the invention with the filter 44 functioning as the high-pass portion of a base band filter.

The outer loop 16 includes an integrator 66 coupled between the lead 46 and a lead 68 for controlling a voltage controlled oscillator 70, also designated as $VCO_1$. The integrator 66 which may be a simple lag or integrator circuit includes a resistor 72 coupled to a lead 74 which in turn is coupled through a resistor 76 to a lead 79 and an operational amplifier 77 to the lead 68. The lead 79 is also coupled through a charging capacitor 78 and a resistor 80 to the lead 68. In normal operation, the resistors 72 and 80 are disconnected from the filter 66 by by-pass switches 82 and 84 so that the lag function is performed, a lead function being developed by the filter 44 as will be explained subsequently in further detail. However, in a mode of operation when only the outer loop 16 is utilized, the switches 60, 82 and 84 are opened resulting in the inner loop 40 being disconnected and a lead term being developed by the modified filter 66. The integrator 66 is designed to have a relatively narrow low pass band during all modes of operation. The voltage controlled oscillator 70 responds to the signal on the lead 68 to apply a signal $\Delta f_{01}$ through a lead 86 to the mixer 14. It is to be noted at this time that the AC coupling of the filter 44 allows the automatic frequency control loop 16 to correct for long term frequency drifts because of the stability of the voltage controlled oscillator 50 in response to low frequency modulations.

The phase detector 34 may be any conventional circuit such as shown on page 553 of the book "Electronic Methods," volume 2, by E. Bleuler and R. O. Haxby, published by The Academic Press of New York. The voltage controlled oscillators 50 and 70 may be conventional circuits as well known in the art such as shown on page 5–38 of "A Handbook of Selected Semiconductor Circuits," NObsr 73231, NAVSHIPS 93484, Bureau of Ships, printed by Superintendent of Documents, U.S. Government Printing Office, Washington, D.C. Automatic gain control circuits may be included in the system of FIG. 1 as are well known in the art. It is to be noted that the invention is not to be limited to the illustrated circuits of the high pass filter 44 and the integrator 66 as other circuit arrangements may be utilized within the principles of the invention.

To generally explain the operation of the system of

FIG. 1, the output signal of a linearized phase detector is proportional to the phase differences of the input signals. However, phase difference is the integral of frequency difference so that the transfer function of the phase detector 34 to a frequency difference input signal is that of an integrator. The output signal developed by a voltage controlled oscillator such as 50 represents a frequency difference proportional to the control voltage input signal so that its transfer function is simply a gain constant $K_2$. The output signal developed by the phase detector 34 for a condition of zero phase difference or deviation from a 90 degree reference phase condition develops a voltage that defines an equal voltage-time area above and below a voltage reference level. A shift of the carrier signal in frequency to a higher frequency, for example, causes the signal on the lead 38 to shift in phase so that a more positive voltage is applied to the lead 38. As a result, a modulation is developed on the lead 38 and on the lead 48 representative of the instantaneous frequency variation of the carrier signal on the lead 36. The signal applied to the lead 48 shifts the frequency of the voltage controlled oscillator 50 so that the voltage controlled oscillator signal on the lead 62 tracks the carrier signal in frequency. The loop 40 responds to only high frequency perturbations on the lead 38 so that at low frequencies, the voltage controlled oscillator 50 functions as a reference oscillator.

The automatic frequency control loop 16 which has a narrow low-pass frequency band provided by the integrator 66 responds only to low frequency drifts or variations on the lead 38 so that the carrier frequency is shifted at the mixer 14 and applied to the phase detector 34 in a frequency modulation range at which the voltage controlled oscillator 50 is operating as a stable local or reference oscillator. Thus, because the low frequency drifts of the carrier signal are unable to affect the voltage controlled oscillator 50, the automatic frequency control loop 16 operates to maintain the average carrier frequency centered in the pass band of the filter bank 19. The phase detector 34 operates in a similar manner to that discussed above, in response to the control of the loop 16 except the frequency applied from the voltage controlled oscillator 50 is stable.

The system of FIG. 1 is arranged so that the phase shift in each of the loops 16 and 40 in response to an increase or decrease in frequency minimizes the phase error. If the frequency of the outer loop voltage controlled oscillator 70 is less than the input frequency on the lead 12, the sense or direction of frequency change of the feedback signal must be identical in both loops. If the frequency of the outer voltage controlled oscillator 70 is on the high side of the input frequency, the sense of frequency change of one of the loops must be reversed for stability. Thus, the voltage controlled oscillator 70 may respond to an increase of voltage on the lead 68 to increase its frequency of operation and the voltage controlled oscillator 50 may be selected to respond to an increase of voltage on the lead 48 to decrease its frequency of operation.

Figure 2:
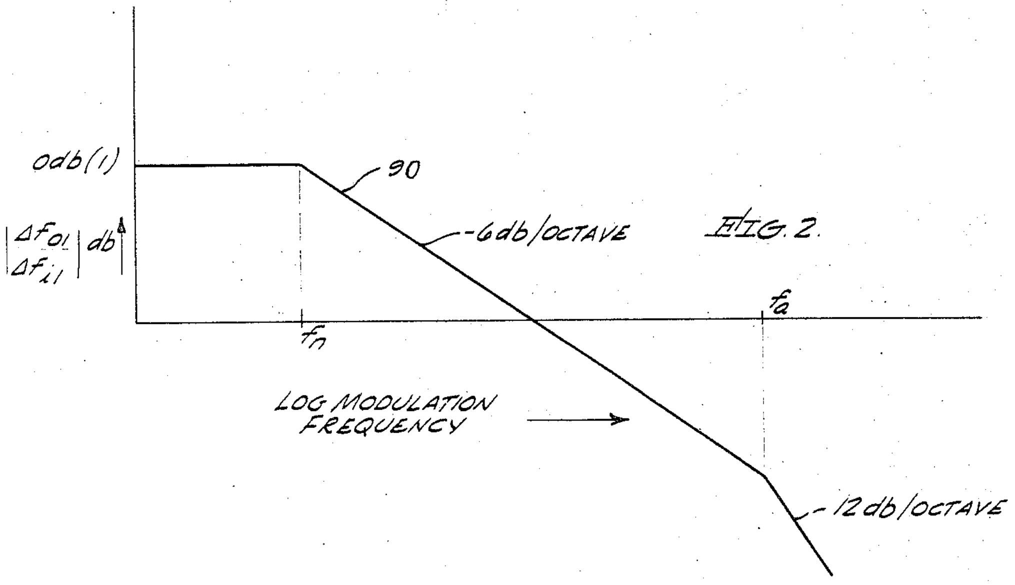
FIG. 2 is an asymptotic graph of the ratio of the frequency deviation of the automatic frequency control loop or outer loop voltage controlled oscillator over the frequency deviation of the input signal versus modulation frequency for explaining the operation of the automatic frequency control loop.

Referring now to FIGS. 2, 3 and 4, the operation of the demodulator system of FIG. 1 will be explained in further detail. A curve 90 of FIG. 2 shows the response of the voltage controlled oscillator 70 of the automatic frequency control loop 16. In the frequency range less than the natural resonant frequency $f_n$ of the loop 16, substantially all of the input deviation $\Delta f_{i1}$ is tracked in response to the signal $\Delta f_{01}$ of the voltage controlled oscillator 70. At frequencies greater than $f_n$, the response of the voltage controlled oscillator 70 falls off at a rate of −6 db (decibels) per octave and has substantially small effect on the tracking, that is, the voltage controlled oscillator 70 is a reference oscillator to modulation frequencies greater than $f_n$. Thus, at frequencies greater than $f_n$, the mixer 70 responds to a substantially constant frequency applied from the voltage controlled oscillator 70.

A curve 92 of FIG. 3 shows the response of the voltage controlled oscillator 50 of the demodulator loop 40. The frequency deviation $\Delta f_{o2}$ falls off at a rate of 6 db per octave at frequencies below the natural resonant frequency $f_n$ of the loop 16. Between frequencies $f_n$ and $f_a$ which is the natural break frequency of the high pass filter 44, the asymptotic gain is unity, that is, all of the input frequency deviation is tracked by the voltage controlled oscillator 50. Thus the voltage controlled oscillator 50 is substantially unresponsive to frequency changes below the frequency $f_n$ to allow the automatic frequency control loop 16 to function in accordance with the invention. The deviation of voltage controlled oscillator 50 approaches zero as the modulating frequency approaches zero. Frequency deviation increases at a rate of 6 db per octave for $$0<f<\sqrt{2}\frac{f_a f_n}{f_H}$$

where $f_H$ is the hold-in frequency range of the outer loop 16. At the frequency $$\sqrt{2}\frac{f_a f_n}{f_H}$$

the ratio $\Delta f_{o2}/\Delta f_{i1}$ is $$2\left(\frac{f_a}{f_H}\right)^2$$

which is a quantity that is much less than unity. Thus, $$\sqrt{2}\frac{f_a f_n}{f_H}$$

is the open-loop cut-off frequency of the automatic frequency control loop 16. The 6 db per octave increase of $VCO_2$ deviation at modulating frequencies less than $$\sqrt{2}\frac{f_a f_n}{f_H}$$

is caused by the 6 db per octave roll-off of the phase detector 34. For modulating frequencies between $$\sqrt{2}\frac{f_a f_n}{f_H}$$

and $f_n$ the ratio of voltage controlled oscillator 50 deviation to input signal deviation increases at a rate of 12 db per octave because the open loop gain of the automatic frequency control loop 16 developed as a result of the operation of the integrator 66, rolls off at a rate of 12 db per octave for modulating frequencies between $$\sqrt{2}\frac{f_a f_n}{f_H}$$

and $$\frac{f_n}{\sqrt{2}}$$

Thus, the voltage controlled oscillator 50 tracks input deviation for $f_n<f<f_a$ while the deviation of voltage controlled oscillator 70 is insignificant. The response of the loop 40 to frequencies greater than $f_a$ of the curve 92 which decreases at 6 db per octave has a substantially small effect on the system operation.

A curve 94 of FIG. 4 shows the ratio of output voltage $e_o$ of the phase detector 34 to input frequency deviation $\Delta f_{i1}$ as a function of modulation frequency. A curve 96 shows half of the IF (intermediate frequency) bandwidth $B_{IF/2}$ provided by one of the filters of the filter bank 19. The bandwidth $B_{IF/2}$ determines and is the effective noise bandwidth of the demodulator loop 40. A curve 98 shows the loop noise bandwidth of the loop 40 that would result in the absence of IF filtering.

Over a range of modulation indexes of practical interest, the noise bandwidth resulting from a conventional phase lock loop is greater than the IF bandwidth required to pass the signal to be demodulated. Thus the IF filters of the filter bank 19 which are of substantially minimum allowable bandwidth precede the inner loop to limit the noise power passed therethrough. A high loop gain provided by the large loop bandwidth of the curve 98 results in a relatively small phase error due to input signal modulation, that is, the error voltage required to cause the voltage controlled oscillator 50 to track input carrier frequency deviation is relatively small compared to the error voltage which is caused by input thermal noise. One component of phase error which normally degrades threshold sensitivity is thus substantially eliminated so that a high thresold sensitivity is provided. The bandwidth of the IF filtering may be varied by the switch 28 without substantially changing the loop parameters. The bandwidth of the automatic frequency control loop 16 is controlled by the integrator 66 to be relatively narrow so that a minimum of noise is passed therethrough. Thus the threshold sensitivity of the automatic frequency control loop 16 is much greater than that of the demodulator loop 40, so that the sensitivity of the demodulator loop 40 is not degraded.

To further explain the operation of the dual loop demodulator of FIG. 1, the transfer function of the equivalent single inner loop 40 is:

$$\frac{e_o}{\Delta\omega_i}=\frac{\omega_2 K\phi}{\omega_a S}\frac{\left(1+\frac{S}{\omega_2}\right)}{\left(1+\frac{S}{\omega_a}\right)}\text{ for } \omega_a>>\omega_2 \quad (1)$$

where:

$K\phi$ is the phase detector gain in volts per radian,
$\omega_2$ is the highest critical radian frequency of the inner loop network,
$\omega_a$ is the 3 db closed-loop bandwidth in radian frequency or $2\pi f_a$,
S is the complex frequency variable which may be reduced to $(J\omega)$.

The open-loop gain of the outer loop 16 may be expressed as:

$$G_1(S)=\frac{\omega_2\omega_H}{\omega_a S}\frac{1+\frac{S}{\omega_2}}{\left(1+\frac{S}{\omega_a}\right)\left(1+\frac{S}{\omega_1}\right)} \quad (2)$$

where
$\omega_H$ is $2\pi K_\phi K_1$ radians per second or the hold in range,
$\omega_1$ is $2\xi\omega_n\omega_a/\omega_H$ in terms of the damping ratio $\xi$, and
$\omega_2$ is $\omega_n/2\xi$ where $\omega_n$ is $2\pi f_n$.

The transfer function of the voltage controlled oscillator 50 or $VCO_2$ to dual-loop input deviation may be expressed in terms of radian frequency as:

$$\frac{\Delta\omega_{o2}}{\Delta\omega_{i1}}=\frac{\omega_a}{\omega_H}\frac{2\xi}{\omega_n}\frac{S\left(1+\frac{S\omega_H}{2\xi\omega_a\omega_n}\right)}{1+2\xi\frac{S}{\omega_n}+\left(\frac{S}{\omega_n}\right)^2+\frac{S^3}{\omega_a\omega_n^2}} \quad (3)$$

The inner loop 40 provides the phase lead term $$\left(1+\frac{S}{\omega_2}\right)$$

in the numerator of Equation 1 which is necessary to provide proper damping of the automatic frequency control loop 16. Thus, in dual loop operation, the automatic frequency control loop filter arrangement 66 is a simple lag circuit or an integrator. The transfer function of the integrator 66 may be expressed as $$F_1(S)=\frac{1}{1+\frac{S}{\omega_1}}$$

for a passive network, or as $$F_1(S)=\frac{\omega_1}{S}$$

for an active integrator.

In order to provide maximum informational bandwidth for the actual received carrier power, the IF bandwidth is varied by controlling the switch 28. As is well known in the art, the received carrier-to-noise density ratio may vary such as a result of rainfall attenuation or unequal power split between a plurality of transmitted carriers at a satellite transmission or transponder station, for example. Decreasing the IF bandwidth decreases the noise bandwidth to increase (or extend) the threshold sensitivity while decreasing the amount of received information. Another bandwidth reduction provided by the system in accordance with the invention is to disable the inner loop in response to the switch 60 so that the voltage controlled oscillator 50 becomes a constant source of reference frequency. As indicated by Equation 1, the demodulator loop 40 is equivalent to a phase detector whose transfer function is:

$$\frac{e_o}{\Delta\omega_i}=\frac{\omega_2}{\omega_a}\frac{K_\phi}{S}\left(1+\frac{S}{\omega_2}\right) \quad (4)$$

when the demodulator loop is opened, only the normal phase detector transfer function $K_\phi/S$ is provided. Thus, to maintain optimum automatic frequency control loop performance when the loop 40 is opened, the integrator 66 must be modified to generate a term $$\frac{\omega_2}{\omega_a}\left(1+\frac{S}{\omega_2}\right)$$

to provide the transfer function of Equation 4. When the switch 60 is opened, switches 82 and 84 are also opened to provide a filter characteristic with a lead term so that the automatic frequency control loop is properly damped. In this type of operation, phase modulation of the carrier may be detected by the phase detector 34. Also, this type of operation may be utilized to provide antenna pointing information. For example, Teletype signals may be received during this modified type of operation.

Thus, the system in accordance with the principles of the invention utilizes an inner demodulator loop that is AC coupled to receive the output signal developed by the phase detector. Because of the short time constant of the inner loop filter, the inner loop voltage controlled oscillator remains stable or at a fixed frequency so that carrier frequency shifts at relatively low frequencies are corrected by the outer automatic frequency control loop. A simple integrator may be utilized in the outer loop because the inner loop provides the lead term required by the outer loop for stability. The outer loop has a relatively narrow pass band so that the threshold sensitivity of the inner loop is not degraded thereby. The outer automatic frequency control loop operates at low frequencies and the inner demodulator loop operates at high frequencies. The demodulator system utilizes narrow band IF filtering to provide a high threshold sensitivity to the demodulator loop. For operation in response to a received signal at a relatively low power level, a switching arrangement is provided in accordance with the invention so that the inner loop is disconnected and the outer loop integrator is changed to a filter to include the lead term required for a stable loop.

What is claimed is:

1. A demodulator system having a source of signals comprising
- mixing means coupled to the source of signals,
- a phase detector coupled between said mixing means and an output terminal,
- a first loop coupled between said output terminal and said phase detector and including a first voltage controlled oscillator,
- and a second loop coupled between said output terminal and said mixing means and including a second voltage controlled oscillator.

2. A demodulator system responsive to a source of signals comprising

- a mixer coupled to the source of signals,
- narrow band filter means coupled to said mixer,
- a phase detector coupled to said narrow band filter means,
- a high pass filter coupled to said phase detector,
- a first voltage controlled oscillator coupled between said high pass filter and said phase detector,
- an integrator coupled to said phase detector and having a low frequency pass band,
- and a second voltage controlled oscillator coupled between said integrator and said mixer.

3. A demodulator system responsive to a source of signals comprising
- mixing means coupled to the source of signals,
- filter means coupled to said mixing means,
- phase detecting means coupled to said filter means and having an output terminal,
- high pass filter means coupled to the output terminal of said phase detecting means,
- first controlled oscillator means coupled between said high pass filter means and said phase detecting means,
- low pass filter means coupled to the output terminal of said phase detecting means and having integrating characteristics,
- and second controlled oscillator means coupled between said low pass filter means and said mixing means.

4. A demodulator system for responding to a source of signals to apply a demodulated voltage to a terminal, said signals having low frequency variations of the carrier and high frequency informational modulations of the carrier comprising
- a mixer coupled to the source of signals,
- a narrow band filter coupled to said mixer,
- a phase detector coupled between said narrow band filter and the terminal,
- a high pass filter coupled to the terminal,
- a first voltage controlled oscillator coupled between said high pass filter and said phase detector,
- an integrator coupled to said terminal,
- and a second voltage controlled oscillator coupled between said integrator and said mixer, whereby said first voltage controlled oscillator responds to the high frequency modulations of the carrier, and said second voltage controlled oscillator responds to the low frequency variations of the carrier with said first voltage controlled oscillator being at a substantially stable frequency.

5. A demodulator system for responding to a source of signals at intermediate frequency to apply a demodulated voltage to a system terminal, said signals having low frequency variations of the carrier and high frequency informational modulations of the carrier comprising
- a mixer coupled to the source of signals,
- a narrow band filter coupled to said mixer,
- a phase detector having first and second input terminals and an output terminal, said first input terminal coupled to said narrow band filter and the output terminal coupled to the system terminal,
- a high pass filter coupled to the output terminal of said phase detector, said high pass filter having a pass band substantially in the frequency band of the high frequency informational modulations of the carrier,
- a first voltage controlled oscillator coupled between said high pass filter and the second input terminal of said phase detector,
- an integrator coupled to the output terminal of said phase detector, said integrator having a pass band substantially in the frequency band of the low frequency variations of said carrier,
- and a second voltage controlled oscillator coupled between said integrator and said mixer, whereby said first voltage controlled oscillator responds to the high frequency modulations of the carrier, and said second voltage controlled oscillator responds to the low frequency variations of the carrier with said first voltage controlled oscillator being at a substantially stable frequency.

6. A demodulator system responsive to a source of signals, the system including a narrow band filter coupled to the source of signals comprising a phase detector coupled between the narrow band filter and an output terminal, a first loop coupled between said output terminal and said phase detector, said first loop including a high pass filter and a first voltage controlled oscillator, switching means coupled in said first loop for selectively opening and closing said first loop, and a second loop coupled between said output terminal and said narrow band filter, said second loop including selectable filter means, a second voltage controlled oscillator and a mixer, said selectable filter means being selectably an integrator when said first loop is closed and a low pass filter when said first loop is open.

7. A demodulator system responsive to a source of signals comprising mixing means coupled to the source of signals, phase detecting means having first and second input means with the first input means coupled to said mixing means and having output means, a first loop coupled between said output means and the second input means of said phase detecting means, said first loop including a voltage controlled oscillator, said first loop having a high pass filter characteristic, and a second loop coupled between said output means and said mixing means, said second loop having a low pass filter characteristic.

8. A demodulator system responsive to a source of signals comprising mixing means coupled to the source of signals, phase detecting means coupled between said mixing means and an output terminal, a first loop coupled between said output terminal and said phase detecting means, said first loop including a high pass filter and a first controlled oscillator, and a second loop coupled between said output terminal and said mixing means, said second loop including integrator means and a second controlled oscillator.

9. A demodulator system responsive to a source of signals comprising phase detecting means coupled to the source of signals and having an output terminal, a first loop coupled between said output terminal and said phase detecting means, said first loop including a high pass filter and a first controlled frequency oscillator, and a second loop coupled between said output terminal and said phase detecting means, said second loop including integrating means, a second controlled frequency oscillator and mixing means.

10. A demodulator system comprising mixing means, band-pass filter means coupled to said mixing means, phase detecting means coupled to said band-pass filter means and having output means, first filter means coupled to said output means and having high pass characteristics, first oscillator means coupled between said first filter means and said phase detecting means, integrator means coupled to said output means and having a low frequency response bandwidth characteristic, and second oscillator means coupled between said integrator means and said mixing means.

11. A demodulator system responsive to a source of signals comprising mixing means coupled to the source of signals, phase detecting means coupled between said mixing means and an output terminal, a first loop coupled between said output terminal and said phase detecting means, said first loop including a high pass filter and a controlled oscillator, and a second loop coupled between said output terminal and said mixing means, said second loop including selectable filter means and a controlled oscillator, said selectable filter means providing an integrating characteristic or a low pass filter characteristic.

12. A demodulator system responsive to a source of signals comprising phase detecting means coupled to the source of signals and having an output terminal, a first loop coupled between said output terminal and said phase detecting means, said first loop including a high pass filter and a first controlled frequency oscillator, means coupled in said first loop for selectively energizing said first loop, and a second loop coupled between said output terminal and said phase detecting means, said second loop including selectable filter means, a second controlled frequency oscillator and mixing means, said selectable filter means selectively providing an integrating characteristic or a low pass filter characteristic.

References Cited

UNITED STATES PATENTS

| | | | |
|---|---|---|---|
| 2,509,212 | 5/1950 | Cook et al. | 325—418 |
| 2,662,181 | 12/1953 | Hugenholtz | 325—418 |
| 3,163,823 | 12/1964 | Kellis et al. | 328—155 |
| 3,209,271 | 9/1965 | Smith | 329—122 |
| 3,212,023 | 10/1965 | Broadhead | 331—25 |

FOREIGN PATENTS

| | | |
|---|---|---|
| 858,888 | 1/1961 | Great Britain. |

ROY LAKE, *Primary Examiner.*

ALFRED L. BRODY, *Assistant Examiner.*

Disclaimer 3,346,814.—*Theodore F. Haggai*, Costa Mesa, Calif. DUAL LOOP DEMODULATOR INCLUDING A PHASE LOCK LOOP AND AN AFC LOOP. Patent dated Oct. 10, 1967. Disclaimer filed Mar. 17, 1971, by the assignee, *Hughes Aircraft Company*.

Hereby enters this disclaimer to claim 1 of said patent.

[*Official Gazette June 8, 1971.*]